United States Patent
Xu

(10) Patent No.: US 8,233,304 B2
(45) Date of Patent: Jul. 31, 2012

(54) HIGH SPEED MEMORY MODULE

(75) Inventor: Chao Xu, Agoura Hills, CA (US)

(73) Assignee: Inphi Corporation, Westlake Village, CA (US)

(*) Notice: Subject to any disclaimer, the term of this patent is extended or adjusted under 35 U.S.C. 154(b) by 544 days.

(21) Appl. No.: 12/505,344

(22) Filed: Jul. 17, 2009

(65) Prior Publication Data
US 2010/0020584 A1     Jan. 28, 2010

Related U.S. Application Data

(60) Provisional application No. 61/084,207, filed on Jul. 28, 2008, provisional application No. 61/090,178, filed on Aug. 19, 2008.

(51) Int. Cl.
*G11C 5/06* (2006.01)
(52) U.S. Cl. .................... 365/63; 365/191; 711/105
(58) Field of Classification Search .................... 365/63, 365/191; 711/105
See application file for complete search history.

(56) References Cited

U.S. PATENT DOCUMENTS

| 8,111,566 B1 * | 2/2012 | Wang et al. .................... 365/198 |
| 2007/0025131 A1 * | 2/2007 | Ruckerbauer et al. .......... 365/63 |
| 2011/0060857 A1 * | 3/2011 | Bennett .......................... 710/125 |

* cited by examiner

*Primary Examiner* — Fernando Hidalgo
(74) *Attorney, Agent, or Firm* — Koppel, Patrick, Heybl & Philpott

(57) ABSTRACT

A memory module may include a circuit board connectable to a system memory bus through a plurality of contacts disposed along one edge of the circuit board, the system memory bus having three positions for connecting memory modules. A plurality of memory chips may be mounted on the circuit board. The circuit board may include a plurality of D/Q traces to couple a corresponding plurality of D/Q signals from respective contacts to the plurality of memory chips or to one or more buffer chips that isolate the system memory bus from the memory chips. Each of the plurality of D/Q traces may have a predetermined trace impedance selected to provide a predetermined D/Q signal quality level when the memory module is installed in any of the three positions on the system memory bus and equivalent memory modules are installed in the other two positions.

6 Claims, 14 Drawing Sheets

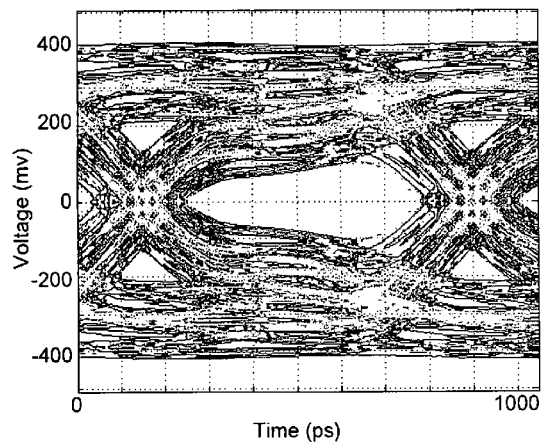 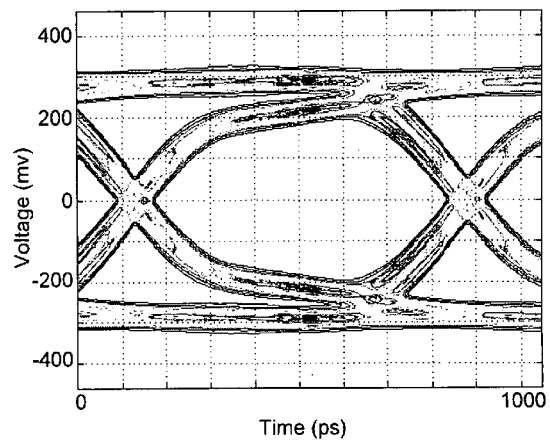
FIG. 12A                    FIG. 12B

HIGH SPEED MEMORY MODULE

RELATED APPLICATION INFORMATION

This patent claims benefit of the filing date of the following provisional patent applications: Application No. 61/084,207, entitled High Speed Memory Module, filed Jul. 28, 2008; and Application No. 61/090,178, entitled High Speed Memory Module with Low Impedance Traces, filed Aug. 19, 2008.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

1. Field

This disclosure relates to memory modules for use in computers and other applications.

2. Description of the Related Art

Computers commonly use random access memory (RAM) for temporary storage of instructions and data. The RAM is commonly packaged in Dual In-line Memory Modules (DIMMs). Current state-of-the-art RAM chips, such as Dual Data Rate 3 (DDR3) Synchronous Dynamic RAM (SDRAM) chips, allow data to be transferred between the RAM chips and an associated memory controller at speeds up to 1600 million transfers per second. However, physical limitations of transmission lines that conduct the data and address signals between the memory controller and the RAM chips may degrade the quality of the signals and thus necessitate operating the RAM chips at less than their maximum speed.

DESCRIPTION OF THE DRAWINGS

FIG. 12A is an eye diagram for a signal received at a memory chip.

FIG. 12B is an eye diagram for a signal received at a memory chip.

DETAILED DESCRIPTION

Description of Apparatus

Figure 1:
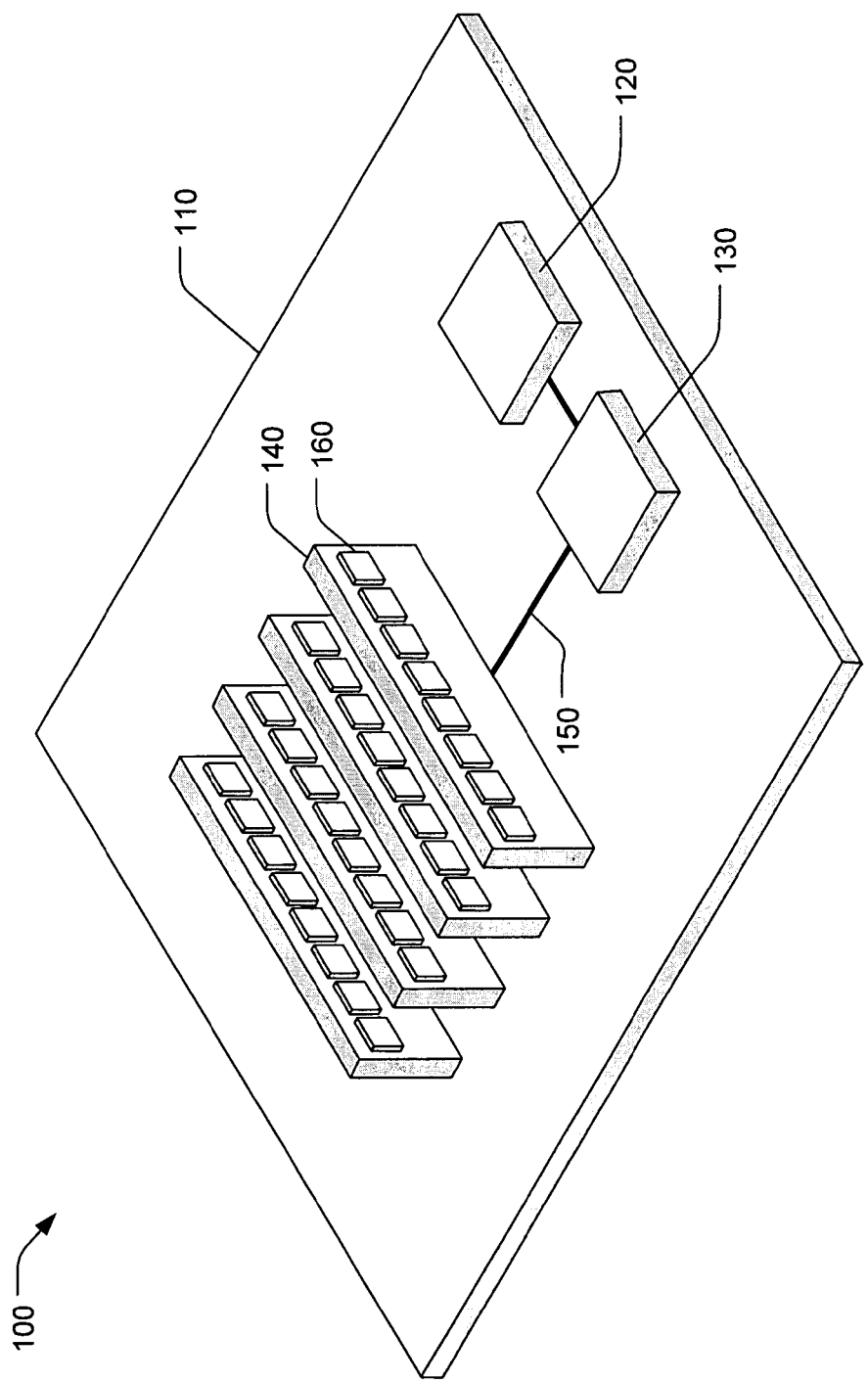
FIG. 1 is a block diagram of a computer.

Referring to FIG. 1, a computer 100 may include a central processing unit (CPU) 120 and a memory controller 130 which may be mounted on a mother board 110. The memory controller 130 and the CPU 120 may be combined on a single integrated circuit chip or may be all or portions of separate integrated circuit chips. The memory controller 130 may be a portion of a so-called "bridge" chip or chipset. The mother board 110 may include connectors to mate with one or more memory modules such as a dual in-line memory module (DIMM) 140. Although a single memory controller 130 is shown in FIG. 1, computers such as servers may have more than one central processing unit and more than one memory controller. Each memory controller may typically be coupled to four connectors which may, in turn, mate with one to four memory modules.

Each DIMM 140 may include a circuit board and a plurality of dynamic random access memory (RAM) chips 160 mounted on the circuit board. The DIMM 140 may include a multiple of 8 RAM chips (as shown in FIG. 1) if the computing device does not use error correction. Each DIMM 140 may include a multiple of 9 dynamic random access memory (RAM) chips 160 if the computing device does use error correction, the extra bit per "byte" providing redundancy in the data signals exchanged between the memory controller 130 and the one or more DIMM 140. Each set of 8 or 9 RAM chips 160 is commonly termed a "rank". Currently, the capacity of each DIMM must be equal to a power of 2. Thus the number of ranks per DIMM may also be a power of 2. Each DIMM 140 may contain 1, 2, 4 or even 8 ranks, and thus may contain 8, 16, 32, or 64 RAM chips (9, 18, 36, or 72 if error correction is used).

Each memory controller 130 may provide address and control signals to the associated DIMMs 140. The memory controller 130 and the one or more DIMMs 140 may exchange bidirectional data signals, traditionally referred to as D/Q signals. A total of more than 200 different address, control, and D/Q signals may be routed between the memory controller 130 and the one or more DIMMs 140 using a corresponding number of electrical connections. The electrical connections may be controlled impedance transmission line or traces on the mother board 120. These signals are represented in FIG. 1 by a single trace 150.

Figure 2:
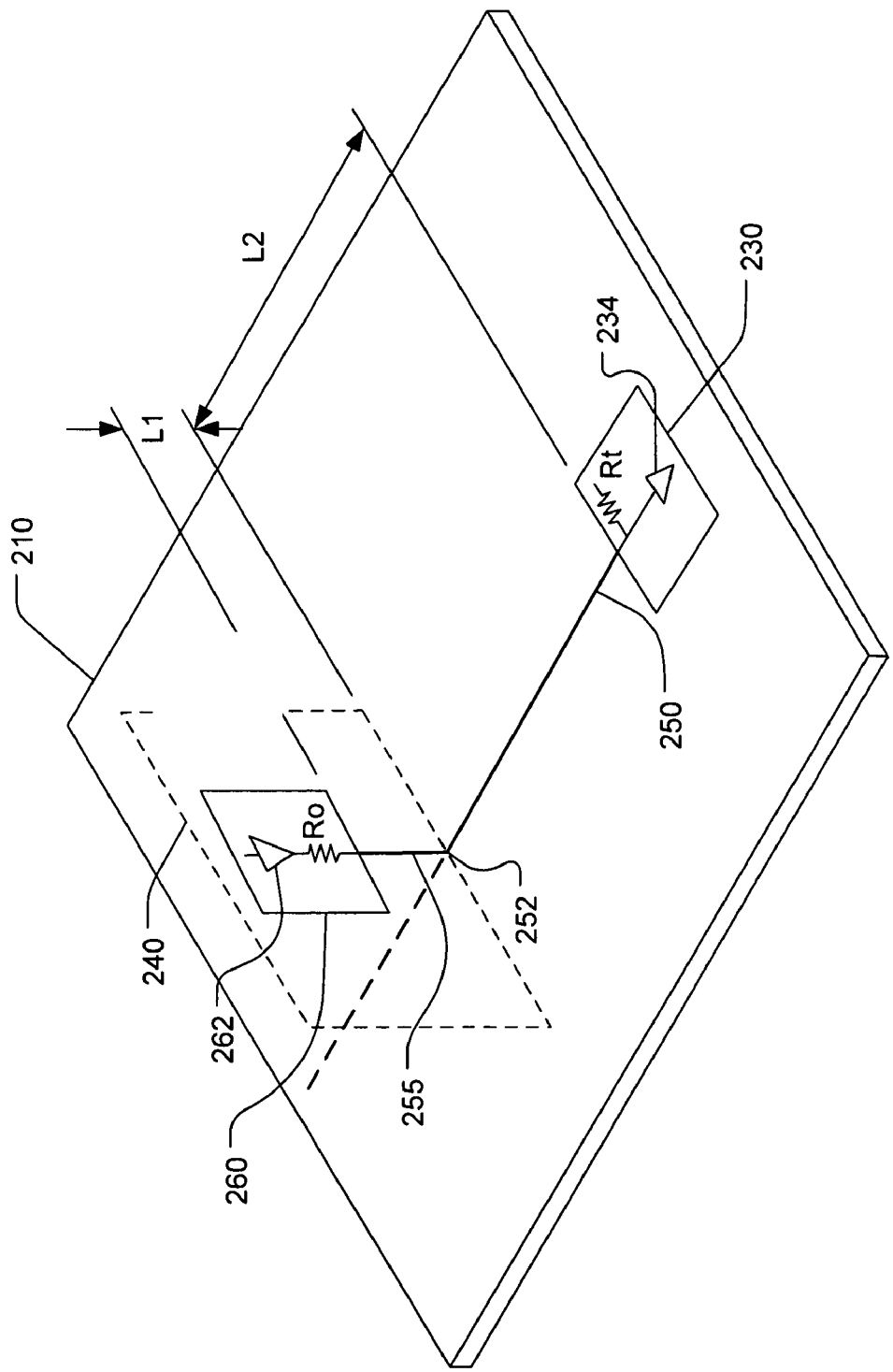
FIG. 2 is a schematic diagram of a read signal path from a memory chip to a memory controller.

FIG. 2 is a schematic diagram of an exemplary D/Q signal connection between a memory controller 230 and a device 260, which may be a portion of a memory module 240, during a memory read operation. The device 260 may be a memory chip or a buffer chip that isolates the memory controller 230 from one or more memory chips included in the memory module 240. A driver 262 within the device 260 provides a D/Q signal representative of a data bit being read from the memory module 240. The D/Q signal may be coupled from the driver 262 to the memory controller 230 by a first transmission line 255 and a second transmission line 250. To read the data stored within the memory module 260, each D/Q signal must be recognized by a receiver 234 within the memory controller 230. The first transmission line 255 may be a trace on a circuit board within the memory module 240 and a portion of a connector mated with the memory module. The first transmission line 255 may have a length L1. The second transmission line 250 may be a trace on a mother board 210. The second transmission line 250 may have a length L2. L2 may typically be about 75 mm to 175 mm (3 to 7 inches). The D/Q transmission lines may be bidirectional, and the memory controller may also include a driver (not shown in FIG. 2) connected to the second transmission line 250.

The first transmission line 255, the second transmission line 250, and an extension of the second transmission line (shown as a dashed line) leading to additional memory module sockets may meet at a "T" junction 252. Since three transmission lines meet at the T junction 252, there may be a discontinuity in the impedance of each line at the junction. This impedance discontinuity may result in reflection of a portion of the signal energy from the T junction 252.

Reflections may also occur at the input to the memory controller 230 and the output of the device 260. Reflections will not occur at the input of the memory controller if the input impedance, represented by the terminating resistor Rt, is equal to the characteristic impedance of the second transmission line 250. However, to minimize power consumption within the memory controller, the input impedance Rt may be substantially higher than the impedance of the second transmission line 250 such that a reflection may occur at the input to the memory controller. Similarly, reflections will not occur at the output of the memory chip if the output impedance of the driver 262, represented by the resistor Rout, is equal to the characteristic impedance of the first transmission line 255. However, to reduce the signal rise time and to increase the signal voltage swing at the memory controller, the output impedance Rout of the driver 262 may be substantially lower than the impedance of the transmission line 255, such that a reflection may occur at the output of the memory chip.

Figure 3:
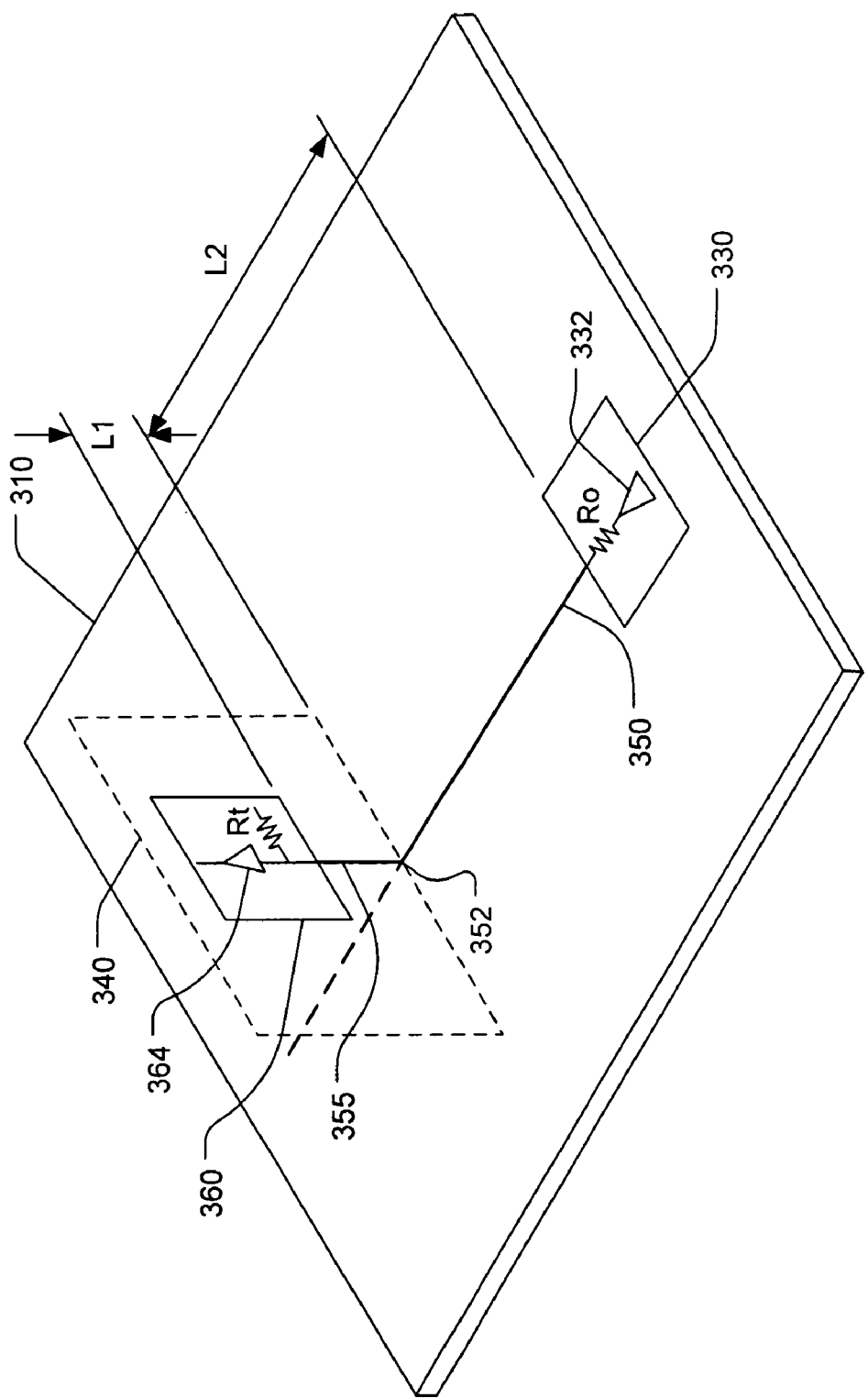
FIG. 3 is a schematic diagram of a write signal path from a memory controller to a memory chip.

FIG. 3 is a schematic diagram of an exemplary D/Q signal connection between a memory controller 330 and a device 360, which may be a portion of a memory module 340, during a memory write operation. A driver 332 within the memory controller 330 provides a signal representative of a data bit to be written into the memory chip. The signal may be coupled from the driver 332 to the device 360 by a first transmission line 355 and a second transmission line 350.

The first transmission line 355, the second transmission line 350, and an extension of the second transmission line (shown as a dashed line) leading to additional memory module sockets may meet at a "T" junction 352. Since three transmission lines meet at the T junction 352, there may be a discontinuity in the impedance of each line at the junction. This impedance discontinuity may result in reflection of a portion of the signal energy from the T junction 352.

Reflections may also occur at the input to the device 360 and the output of the memory controller 330. Reflections will not occur at the input of the memory chip if the input impedance, represented by the terminating resistor Rt, is equal to the characteristic impedance of the first transmission line 355. However, to minimize power consumption within the memory chip, the input impedance Rt may be substantially higher than the impedance of the first transmission line 355. Similarly, reflections will not occur at the output of the memory controller if the output impedance of the driver 332, represented by the resistor Rout, is equal to the characteristic impedance of the second transmission line 350. However, to reduce the signal rise time and to increase the signal voltage swing at the memory chip, the output impedance Rout of the driver 332 may be substantially lower than the impedance of the second transmission line 350.

Figure 4A:
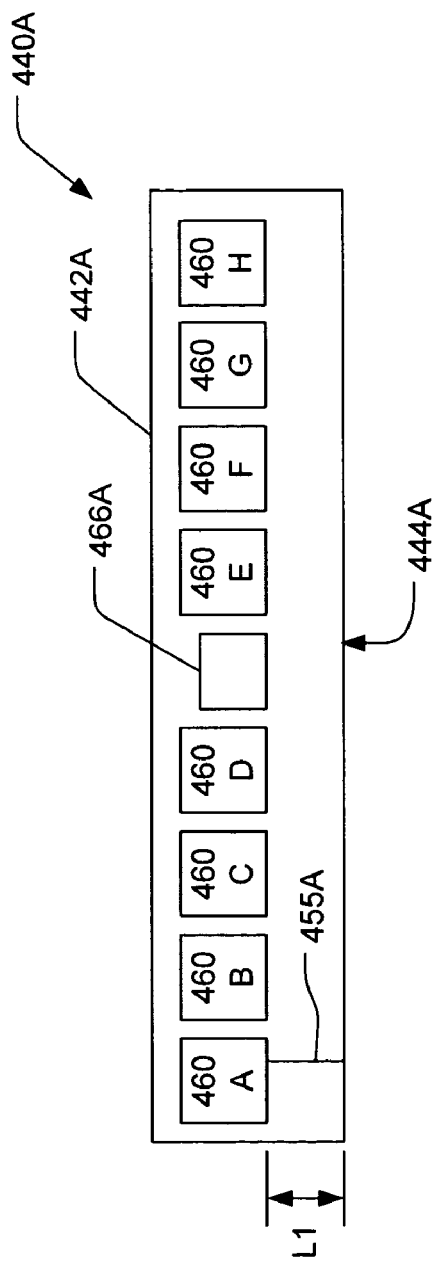
FIG. 4A is a schematic plan view of a dual in-line memory module.

FIG. 4A is a schematic plan view of a conventional DIMM 440A which includes at least eight memory chips 460A-460H mounted on a circuit board 442A. The eight memory chips 460A-460H constitute a first rank of memory chips. The DIMM 440A may include one, two, four, or eight ranks of memory chips. A second rank of eight memory chips (not shown) may be mounted on the back side (not shown) of the circuit board 442A. Third to eighth ranks of memory chips may be physically stacked on top of, or under, the first and second ranks of memory chips (not shown). The DIMM 440A may include a register/buffer chip 466A to buffer and temporarily store address and control signals for the memory chips.

A plurality of conductive contacts (not individually visible) may be disposed along an edge 444A of the circuit board 442A. These contacts may mate with a connector to establish electrical connections between the DIMM 440A and a system memory bus which may be a portion of a motherboard (not shown). In a conventional DIMM, 64 D/Q signals may be routed from the edge 444A of the circuit board 442A directly to the appropriate memory chip or chips by controlled impedance traces such as trace 455A. The contacts associated with the D/Q signals may be distributed along the edge 444A such that each I/O signal connects to the circuit board 442A proximate to the appropriate memory chip. Thus the length L1 of the traces, such as trace 455, carrying the 64 D/Q signals from the edge 444A to the memory chips 460A-460H may be relatively uniform. The length L1 may be, for example, about 20 mm (0.8 inches).

Since a conventional DIMM module 440A may contain 1, 2, 4, or 8 ranks for memory chips, each D/Q signal may connect to 1, 2, 4, or 8 memory chips. Thus the electrical load on each D/Q signal may change substantially depending on the number of ranks in a DIMM module. Since the load on each D/Q signal trace of a computer mother board may not be known until one or more DIMM module is connected to the motherboard, it may not be practical to optimize the memory controller and motherboard to allow operation of the memory chips at their maximum speed.

Figure 4B:
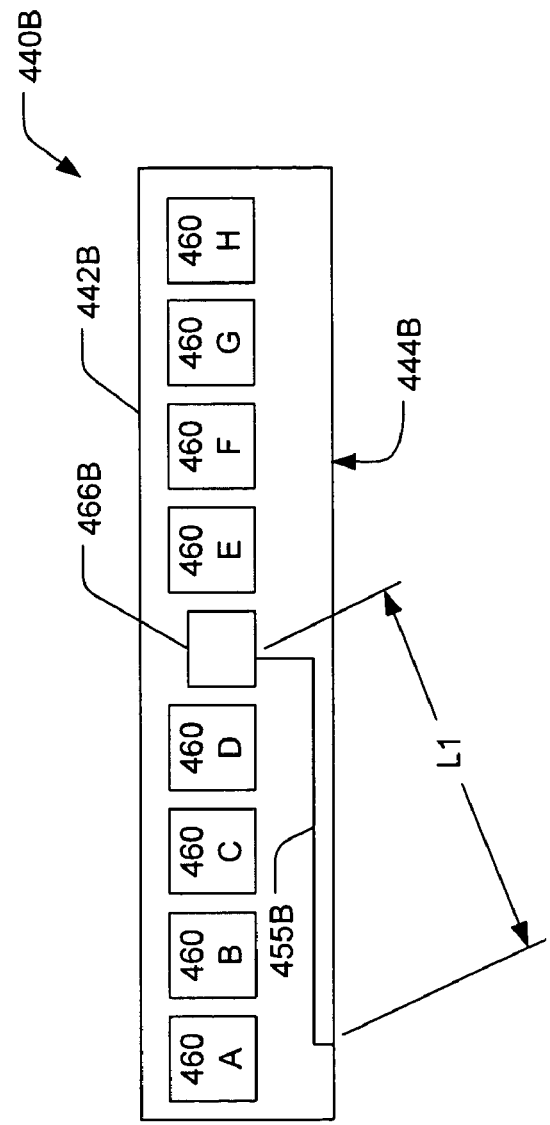
FIG. 4B is a schematic plan view of a fully-buffered dual in-line memory module.

FIG. 4B is a block diagram of a fully-buffered DIMM 440B which includes at least eight memory chips 460A-460H mounted on a circuit board 442B. The fully-buffered DIMM 440B may include one, two, four, or eight ranks of memory chips. The fully-buffered DIMM 440B may include a register/buffer chip 466B to buffer and temporarily store address and control signals. The register chip 466B may also buffer D/Q signals such that each D/Q signal may have only a single load (the register/buffer chip) independent of the number of ranks of memory chips on the DIMM 440B. Since each fully-buffered DIMM 440B places a known load on each D/Q signal, the design of the associated mother board and memory controller may be simplified and the operating speed of the memory chips within a computer may be increased.

To maintain compatibility, the physical locations of the electrical connections to the fully-buffered DIMM 440B may be the same as for the conventional DIMM 440A. Thus the conductive fingers associated with the 64 D/Q signals may be distributed along an edge 444B of the circuit board 442B. However, each of the 64 D/Q signals may be routed from the card edge 444B to the register/buffer chip 466B. Thus the length L1 of some of the D/Q traces, such as trace 455B, carrying D/Q signals from the card edge to the register/buffer chip 466B may be substantially longer that the traces (such as trace 455A) in the conventional DIMM 440A. The length L1 of the D/Q traces in a fully-buffered DIMM may vary, for example, from about 20 mm (0.8 inches) to about 75 mm (3.0 inches).

Figure 5:
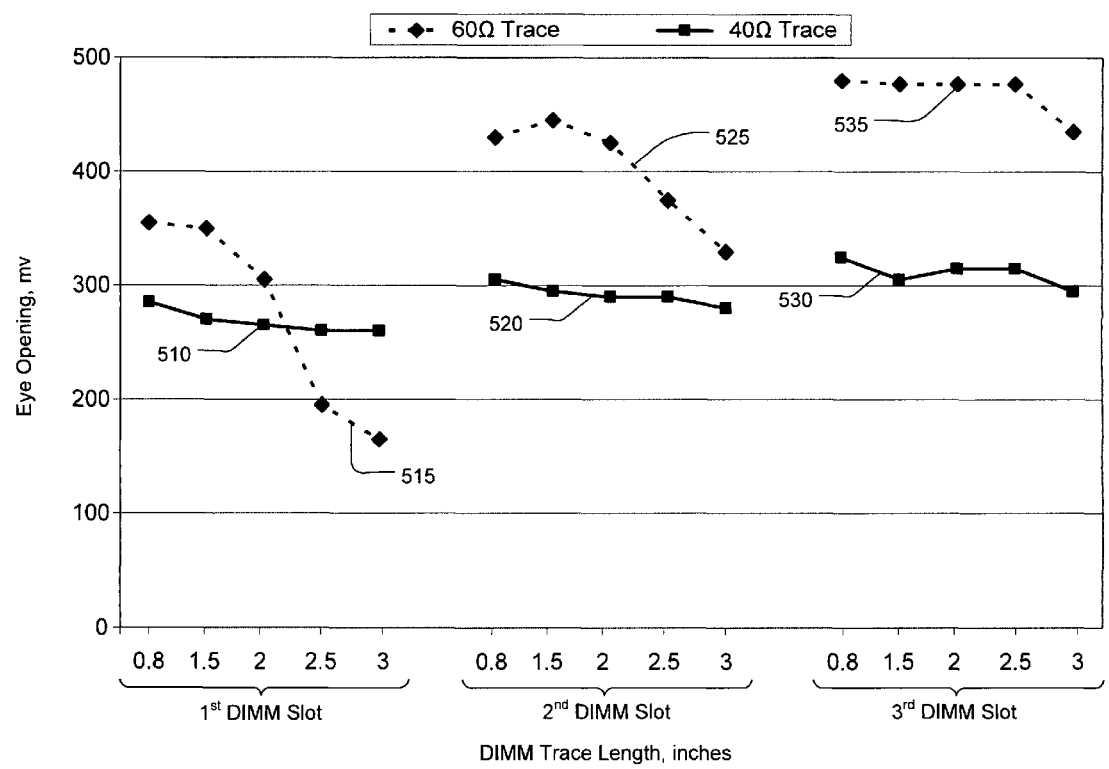
FIG. 5 is a graph showing results from a simulation of memory write cycles.

FIG. 5 is a graph showing results from a numerical simulation of an exemplary D/Q signal during memory write operations. The simulation assumes that three DIMMs are connected to a common memory controller. The three DIMMs are disposed in a first, second, and third slot, or connector, on a mother board. The simulation further assumes that the transmission line on the mother board from a memory controller to the first DIMM slot has a length L2 of 175 millimeters (7 inches) and a characteristic impedance of 40 ohms. The first DIMM slot is the closest to the memory controller and the first, second, and third DIMM slots are spaced on 10 mm (0.4 inch) centers. The simulation further assumes that the output impedance of the memory controller is 27.5 ohms and that the DIMM modules have switchable on-die termination (ODT) such that the input impedance of the first DIMM (the target DIMM being written) is 120 ohms and the input impedances of the second and third DIMMs are 60 ohms.

The memory operation was simulated for the D/Q traces (such as trace 455A or 455B in FIG. 4) within each DIMM having a length L1 of 20, 38, 50, 62, and 75 millimeters (0.8, 1.5, 2, 2.5, and 3 inches) and for characteristic impedances of 40 ohms and 60 ohms.

In FIG. 5, the solid line 510 and the dashed line 515 are graphs of the "eye opening" voltage at a D/Q input to a memory chip on a DIMM module in the first DIMM slot while random data is written into the memory chip at a rate of 1333 million writes per second. The eye opening voltage is plotted as a function of the D/Q trace length within the DIMM. An eye diagram is a graph or an oscilloscope display in which numerous repetitive samples of a digital data signal are superimposed. The term "eye diagram" is commonly used since the pattern may look like a series of eyes between a pair of rails. The eye diagram is useful for visualizing digital signal quality, since the eye diagram encompasses the effects of signal rise and fall times, amplitude noise, and timing errors or phase noise. For a digital signal to be correctly received, the "eye" must be "open", which is to say that there must be a usable margin or "eye opening" between the one and zero voltage levels for a sufficient period of time to correctly sample the signal. For reliable operation of a memory system, the minimum usable eye opening may be about 200 millivolts.

The solid line 510 plots the eye opening voltage at a memory chip assuming the D/Q trace within the DIMM has an impedance of 40 ohms. The dashed line 515 plots the eye opening voltage at the memory chip assuming the D/Q trace within the DIMM has an impedance of 60 ohms. 60-ohm traces are typically employed in current conventional DIMMs.

The solid line 520 and the dashed line 525 are similar graphs of the eye opening at a memory chip on a DIMM in the second DIMM slot. The solid line 530 and the dashed line 535 are similar graphs of the eye opening at a memory chip on a DIMM in the third DIMM slot.

The data plotted in FIG. 5 shows that, with conventional 60-ohm D/Q signal traces (dashed lines 515, 525, 535), the eye opening voltage varies between the three DIMM slots. Further, the eye opening voltage varies with the D/Q signal trace length within the DIMMs, particularly for the DIMM in the first DIMM slot. In particular, when the DIMM installed in the first DIMM slot is a fully buffered DIMM as shown in FIG. 4B, the eye opening voltage at the inputs to some of the memory chips (those inputs connected to traces longer than 2.5 inches) will be less than the minimum useable value of about 200 millivolts.

However, when the DIMM D/Q signal traces have 40-ohm impedance, the eye opening voltages (solid lines 510, 520, 530) are more consistent between the DIMM slots and nearly independent of the D/Q signal trace length. The simulated eye opening voltage is greater than 250 millivolts at each of the three DIMM slots for any signal trace length from 0.8 inches to 3 inches. Thus all three DIMM slots can be populated by fully buffered DIMMs, as shown in FIG. 4B, having 40-ohm I/O signal traces.

Figure 6:
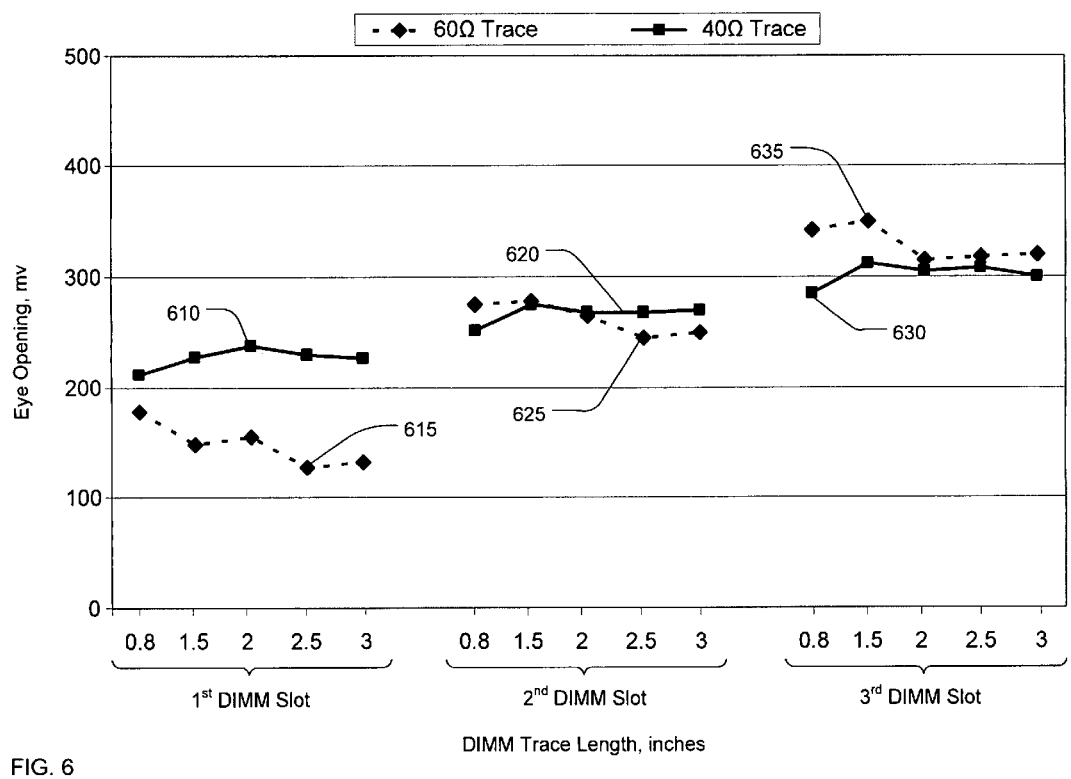
FIG. 6 is a graph showing results from a simulation of memory read cycles.

FIG. 6 is a graph showing results from a numerical simulation of an exemplary D/Q signal during memory read operations. The input impedance of the memory controller is assumed to be 120 ohms, the output impedance of the memory chip is 20 ohms, and the input impedances of the inactive DIMMS are 60 ohms. Other assumptions used for the simulation were the same as used to generate the data shown in FIG. 5.

In FIG. 6, the solid line 610 and the dashed line 615 are graphs of the "eye opening" voltage at a D/Q input to a memory controller chip on a mother board while random data is read from a DIMM module in the first DIMM slot at a rate of 1333 million writes per second. The eye opening voltage is plotted as a function of the D/Q trace length within the DIMM. The solid line 610 plots the eye opening voltage assuming the D/Q trace within the DIMM has an impedance of 40 ohms. The dashed line 615 plots the eye opening voltage assuming the D/Q trace within the DIMM has a conventional impedance of 60 ohms.

The solid line 620 and the dashed line 625 are similar graphs of the eye opening at the memory controller when data is read from a DIMM in the second DIMM slot. The solid line 630 and the dashed line 635 are similar graphs of the eye opening at a memory controller when data is read from a DIMM in the third DIMM slot.

The data plotted in FIG. 6 shows that, with conventional 60-ohm I/O signal traces, the eye opening voltage (dashed line 615, 625, 635) varies when reading from the three DIMM slots. In particular, the eye opening voltage (dashed line 615) when reading from the DIMM in the first DIMM slot is significantly less than the desired minimum value of 200 millivolts. Memory systems with three DIMM slots populated with convention DIMMs may not be operable at 1333 million transfers per second and may be restricted to a lower speed such as 800 million transfers per second.

In contrast, when the DIMM I D/Q traces have 40-ohm impedance, the eye opening voltages (solid line 610, 620, 630) are more consistent between the DIMM slots and nearly independent of the D/Q trace length. In particular, the eye opening voltage (solid line 610) when reading from the DIMM in the first DIMM slot is above the desired minimum value of 200 millivolts.

Figure 7A:
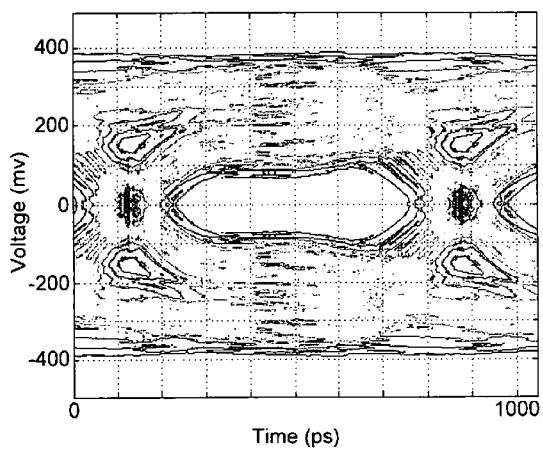
FIG. 7A is an eye diagram for a simulated signal received at a memory controller.

FIG. 7A is an eye diagram showing results from a numerical simulation of an exemplary D/Q line during a memory read operation. The eye diagram shows the input voltage at a memory controller when reading data from a DIMM assumed to be in the first DIMM slot. The D/Q trace on the DIMM is assumed to be 75 mm in length and to have an impedance of 60 ohms. The other assumptions used in the simulation are the same as the assumptions used to generate the data shown in FIG. 6. In the example of FIG. 7A, the eye opening at time=500 picoseconds is 132 millivolts. 132 millivolts is substantially less than the 200 millivolt eye opening desired for reliable memory operation.

Figure 7B:
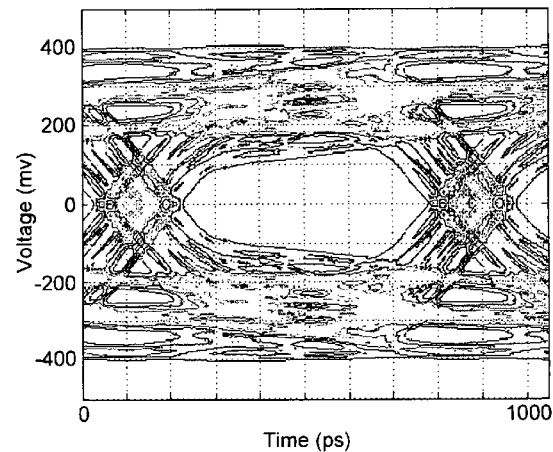
FIG. 7B is an eye diagram for a simulated signal received at a memory controller.

FIG. 7B is an eye diagram showing results from another numerical simulation of an exemplary signal line during a memory read operation. The eye diagram shows the input voltage at a memory controller when reading data from a DIMM assumed to be in the first DIMM slot. The other assumptions used in the simulation are the same as the assumptions used to generate the data shown in FIG. 7A, except the D/Q trace on the DIMM has an assumed impedance of 40 ohms. In the example of FIG. 7B, the eye opening at time=500 picoseconds is 230 millivolts. 230 millivolts may be sufficient for reliable memory operation.

Figure 8:
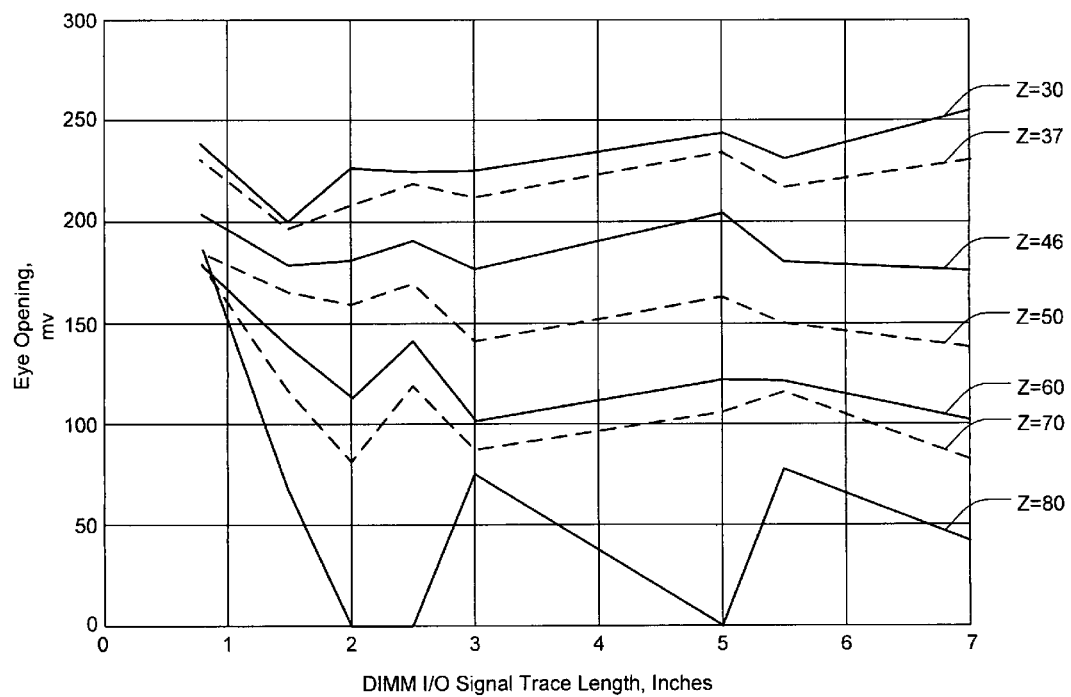
FIG. 8 is a graph plotting eye opening voltage of a simulated signal received at a memory controller versus the length and impedance of DIMM I/O signal traces.

FIG. 8 is graph showing results from another numerical simulation of an exemplary signal line when reading from a DIMM in a first DIMM slot. FIG. 8 graphs the eye opening voltage of a signal received at a memory controller versus DIMM D/Q trace length, with the impedance of the DIMM D/Q traces as a parameter. The assumptions used in the simulation are the same as the assumptions used to generate the data shown in FIGS. 6 and 7, except that the input impedance of the memory controller is 60 ohms and the terminating impedance of the idle second and third DIMM modules is 40 ohms.

Compared to the data shown in FIG. 6, the eye opening voltages plotted in FIG. 8 are lower for equivalent DIMM D/Q trace length and impedance. The reduction in eye opening voltage in the data of FIG. 8 may be due to generally lower signal levels resulting from the assumed lower input impedances for the memory controller and idle second and third DIMM modules. In agreement with FIG. 5 and FIG. 6, FIG. 8 also demonstrates that lower DIMM D/Q trace impedance results in lower dependence of eye opening voltage on DIMM D/Q trace length. Specifically, the variation of eye opening voltage, for DIMM D/Q trace lengths from 0.8 to 3.0 inches, is less than ±10% when the DIMM D/Q trace impedances is from 37 to 46 ohm. In contrast, the variation of eye opening voltage, for the same range of DIMM D/Q trace length, is about ±28% for 60 ohm DIMM D/Q traces. Similarly. FIG. 5 and FIG. 6, which are based on different assumptions from the assumption used to generate the data for FIG. 8, show that the variation of eye opening voltage (for the first DIMM slot and DIMM D/Q trace lengths from 0.8 to 3.0 inches) is about ±6% for both read and write for 40 ohm DIMM D/Q traces. In contrast, the variation of eye opening voltage (for the first DIMM slot and DIMM D/Q trace lengths from 0.8 to 3.0 inches) is about ±28% for write and ±17% read with 60 ohm DIMM D/Q traces.

As expected, an effect of lowering the DIMM D/Q trace impedance from 60 ohms, as used on conventional DIMMs, to a lower value, such as 40 ohms, may be to incrementally increase I/O signal amplitude and thus incrementally increase D/Q signal eye opening. However, the simulation results shown in FIGS. 4 to 8 demonstrate that lower DIMM D/Q trace impedances have the unexpected effect of substantially reducing the dependence of eye opening voltage on DIMM I/O signal trace length. Thus lowering the impedance of the D/Q traces within the DIMM may be particularly significant for DIMMs, such as fully-buffered DIMMs, having at least some long D/Q traces. Additionally, lower DIMM D/Q trace impedances also provide the unexpected benefit of substantially reducing the dependence of eye opening voltage on DIMM slot position. Thus lowering the impedance of each D/Q trace between the DIMM card edge connector from 60 ohms to a lower value such as 40 ohms may enable fast (transfer rates equal to, or more than, 1333 million transfers per second) memory systems which include multiple fully-buffered or un-buffered DIMMs.

Figure 9A:
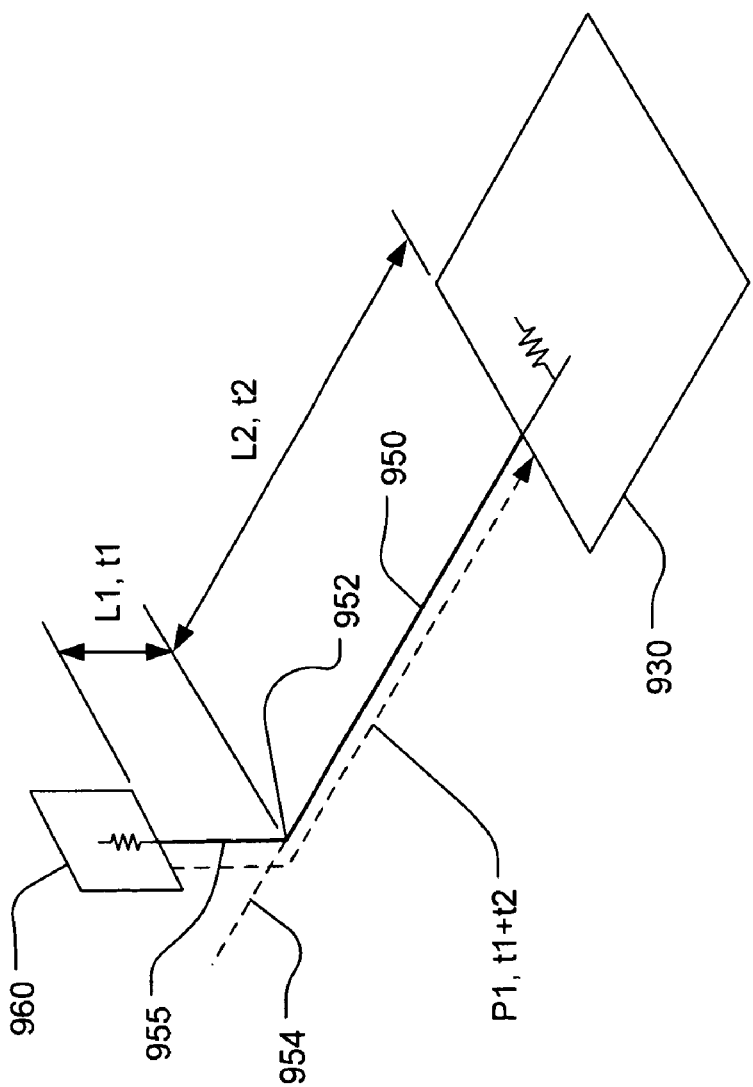
FIG. 9A is a schematic diagram illustrating a primary signal path between a memory controller and a memory chip.

An additional technique that may be used in combination with lowered DIMM D/Q trace impedance is to configure a computer, such as the computer 100, such that spurious signals, which result from reflection of the data signals, effectively cancel each other. FIG. 9A is a schematic diagram of a first signal path PI between a device 960 and a memory controller 930, which may be the memory controller 130. The device 960 may be a memory chip, such as the memory chip 160, or buffer chip such as the buffer chip 466B. A signal launched from the device 960 may propagate along a first transmission line segment 955 which has a length L1 and an associated propagation time t1. The first transmission line 955 may intersect with a second transmission line segment 950 at a T junction 1052. The second transmission line segment may have a length L2 and an associated propagation delay t2. Thus a signal may travel from the device 960 to the memory controller along the signal path P1 which has a total propagation time of t1+t2. However some of the signal energy might not travel along the path P1.

Figure 9B:
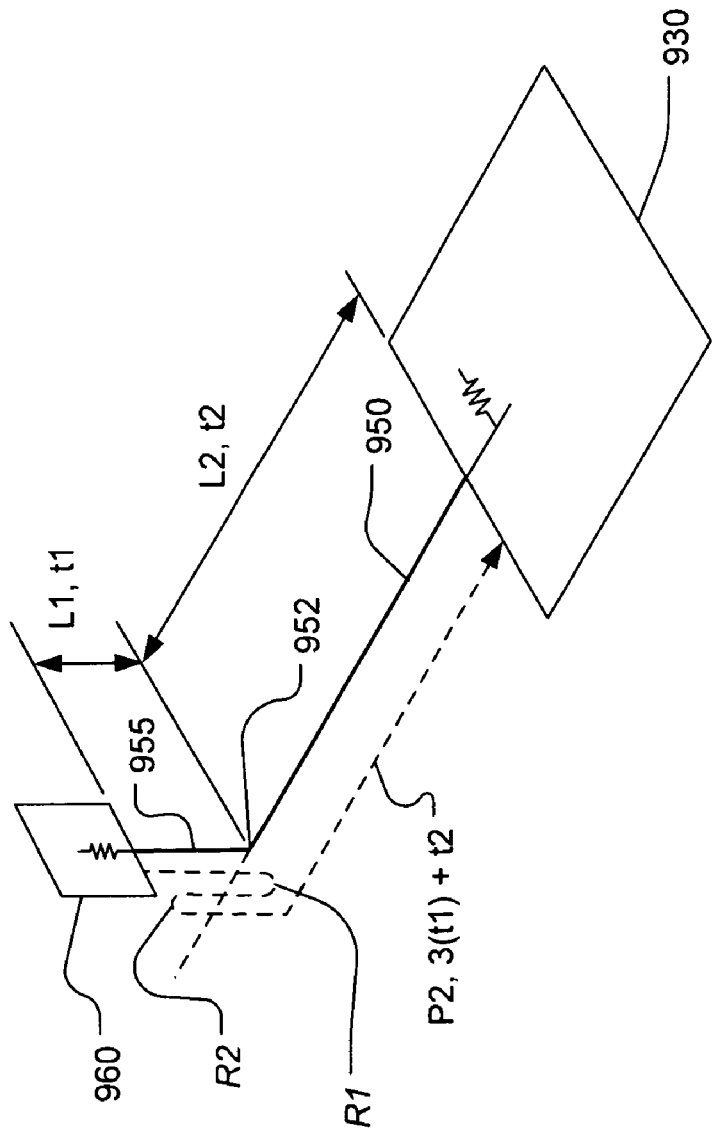
FIG. 9B is a schematic diagram illustrating a reflected signal component propagating between a memory controller and a memory chip.

As shown in FIG. 9B, a first reflection R1 may occur at the T junction 952 such that a portion of the signal energy is reflected back towards the device 960. The un-reflected majority of the signal energy may propagate along the second transmission line segment 950 to the memory controller 930. A second reflection R2 may occur at the input to the device 960 such that a portion of the energy reflected at R1 is reflected back towards the memory controller 930. Thus a twice-reflected portion of the signal may travel from the device 960 to the memory controller 930 along a path P2 which has a total propagation time of 3(t1)+t2.

The signal reflected at the T junction may have the opposite polarity to the signal launched from the device 960, since the reflection R1 is caused by a transition from a higher impedance (the characteristic impedance of the first transmission line segment 955) to a lower impedance (the characteristic impedances of the second transmission line segment 950 and the dashed extension 954 of the second transmission line segment in parallel). The reflected signal (R2) at the output of the device 960 may have the opposite polarity to the reflected signal R1, since the reflection R2 is caused by a transition from a higher impedance (the characteristic impedance of the first transmission line segment 955) to a lower impedance (the output impedance of a driver within the device 960). Thus the twice-reflected that follows the signal path P2 may have the same polarity as the signal originally launched from the device 960.

Figure 9C:
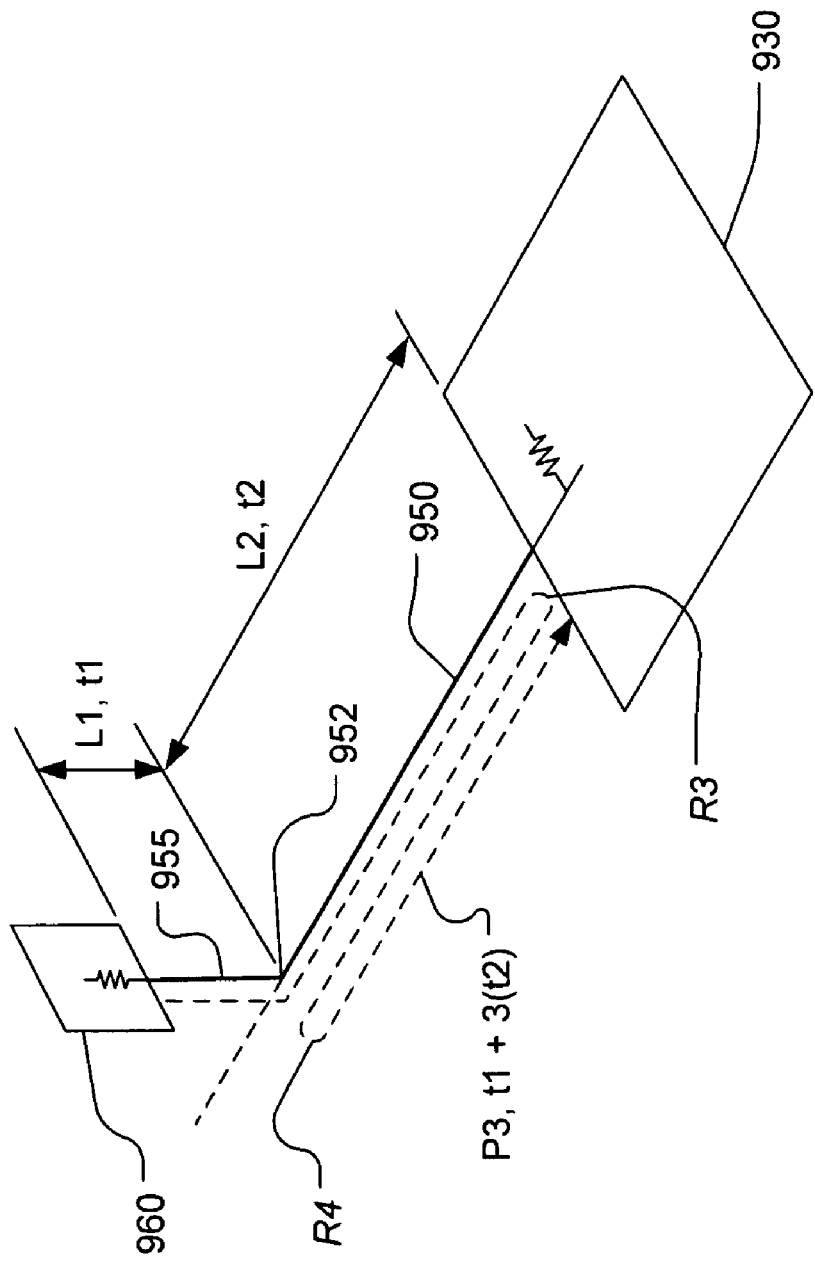
FIG. 9C is a schematic diagram illustrating another reflected signal component propagating between a memory controller and a memory chip.

As shown in FIG. 9C, a third reflection R3 may occur at the input to the memory controller 930 such that a portion of the signal energy is reflected back towards the device 960. A fourth reflection R4 may occur at the T junction 952 such that a portion of the energy reflected at R3 is reflected back towards the memory controller 930. Thus another twice-reflected portion of the signal may travel from the device 960 to the memory controller 930 along a path P3 which has a total propagation time of t1+3(t2).

The signal R3 reflected at the input to the memory controller 930 may have the same polarity to the signal launched from the device 960, since the reflection R3 is caused by a transition from a lower impedance (the characteristic impedance of the second transmission line segment 950) to a higher impedance (the input impedance of the memory controller 930). The signal R4 reflected at the T junction 952 may have the opposite polarity to the reflected signal energy R3, since the reflection R4 is caused by a transition from a higher impedance (the characteristic impedance of the second transmission line segment 950) to a lower impedance (the characteristic impedance of the first transmission line segment 955 and the extension of the second transmission line segment in parallel). Thus the twice-reflected signal that follows path P3 will have the opposite polarity as the signal originally launched from the device 960.

Thus a primary component of a signal output from the device 960 (roughly equivalent to the launched signal energy less the portions reflected at the first and third reflections) may travel from the device 960 to the memory controller 930 along the first signal path PI having a total propagation time of t1+t2. A twice-reflected signal component having the same polarity as the primary signal component may travel from the device 960 to the memory controller 930 along the second signal path P2 having a total propagation time of 3(t1)+t2. Another twice-reflected signal component having the opposite polarity as the primary signal component may travel from the device 960 to the memory controller 930 along the third signal path P3 having a total propagation time of t1+3(t2).

Figure 10:
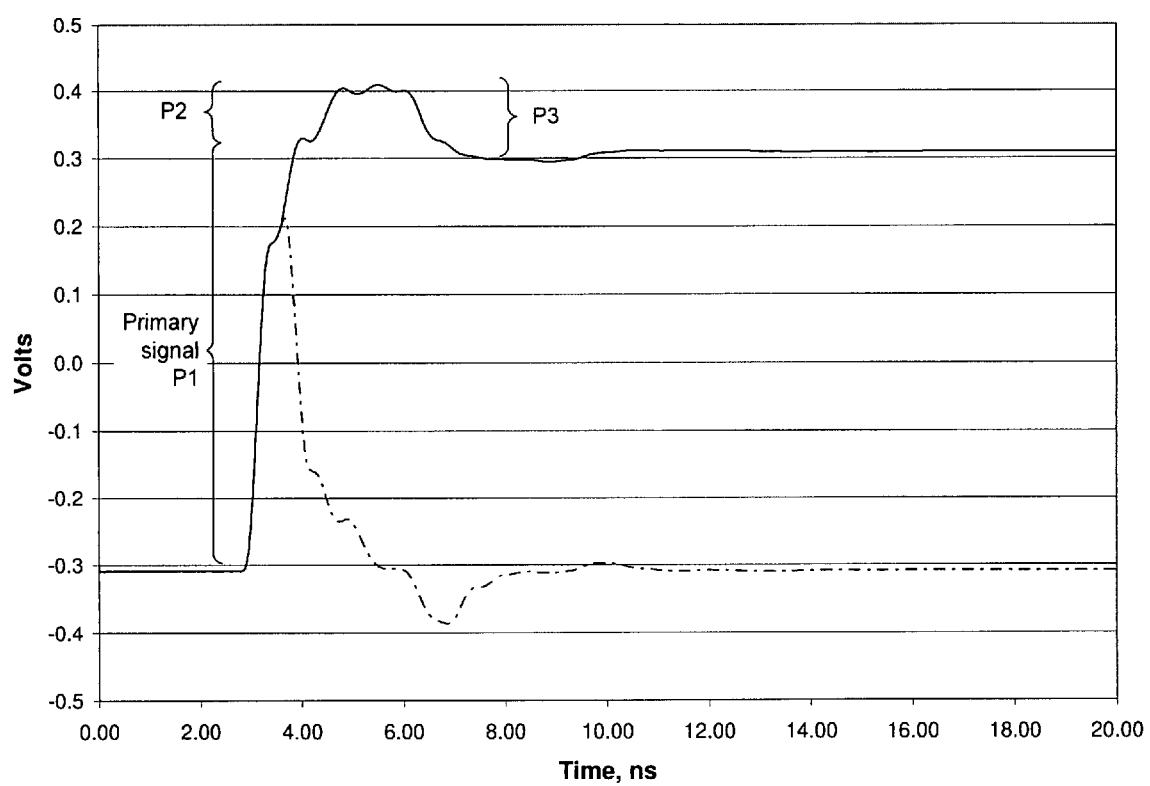
FIG. 10 is a chart plotting signal waveforms versus time.

FIG. 10 is a graph showing results from a numerical simulation of an exemplary signal line, such as the signal line of FIGS. 9A-9C during a memory read operation. In the simulated example, the first transmission line segment (955 in FIGS. 9A-6C) is assumed to have a length L1 of 20 millimeters (0.8 inch) and a characteristic impedance of 60 ohms. The second transmission line segment (950 in FIGS. 9A-9C) has a length L2 of 178 millimeters (7 inches) and a characteristic impedance of 40 ohms. Assuming 178 millimeters for the length L2 of the second transmission line segment may be representative of the longest distance anticipated between a memory controller and a DIMM in a computer.

In FIG. 10, the solid line is a graph of the voltage at an input to a memory controller in response to a voltage step output from a memory chip. The voltage at the input to the memory controller has three major components. A primary component travels along a path P1 having a propagation time of t1+t2, as shown in FIG. 9A. A first twice-reflected component travels along Path P2 having a propagation time of 3(t1)+t2, as shown in FIG. 9B. A second twice-reflected component travels along a path P3 having a propagation time of t1+3(t2), as shown in FIG. 9C. Since t1 is short compared to t2, the second twice-reflected component that travels along path P3 arrives at the memory controller long after (2 nanoseconds after) the first twice-reflected along path P2.

In FIG. 10, the dashed line is a graph of the voltage at the input to the memory controller in response to a 750 picosecond voltage pulse launched by the memory chip. A 750 picosecond pulse is representative of a single bit being read from the memory chip at a data rate of 1300 transfers per microsecond. The first and second twice-reflected components of the pulse continue to propagate in the transmission lines after the original voltage pulse has ended. These reflected components are essentially noise, or inter-symbol interference, that may degrade the quality of signals subsequently launched from either the memory chip or the memory controller.

Figure 11:
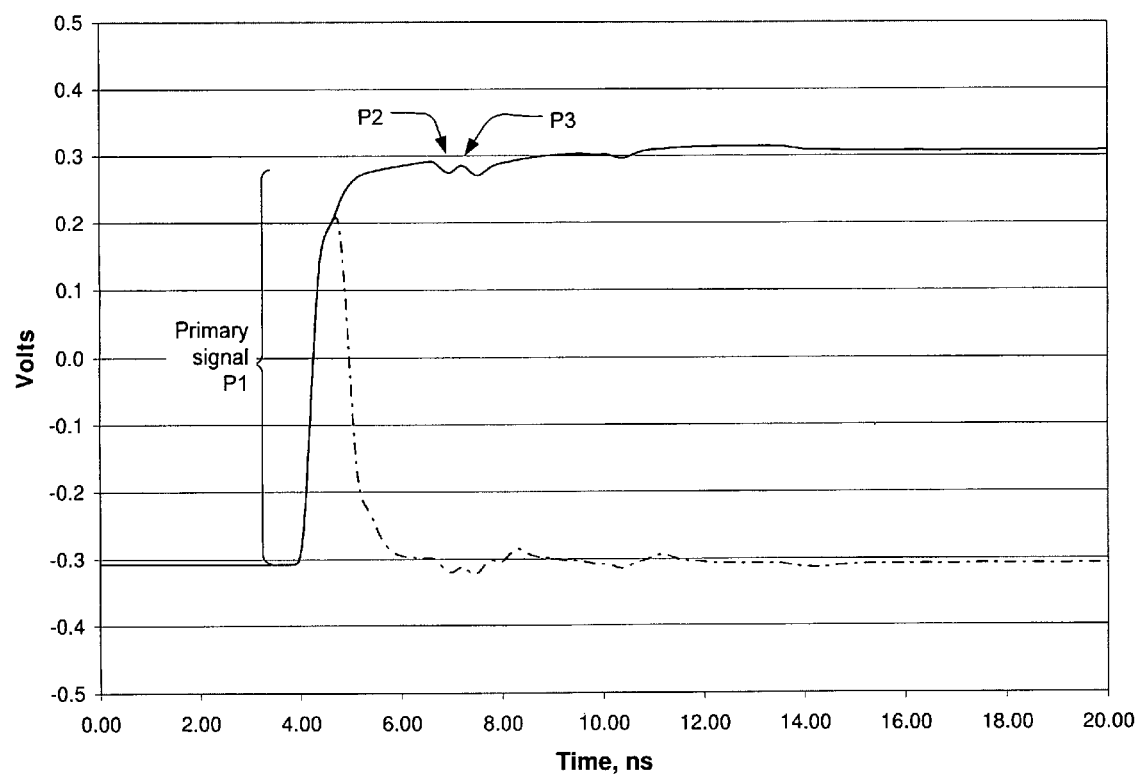
FIG. 11 is a chart plotting signal waveforms versus time.

FIG. 11 is a graph showing results from another numerical simulation of an exemplary signal line, such as the signal line of FIGS. 9A-9C, during a memory read operation. In this example, the lengths L1, L2 of the first and second transmission line segments (955, 950 in FIGS. 9A-9B) are both assumed to be 178 millimeters (7 inches) and the propagation times t1, t2 of the first and second transmission line segments are assumed to be equal. Both of the first and second transmission line segments have a characteristic impedance of 40 ohms. Setting t1=t2 results in 3(t1)+t2=t1+3(t2), such that the propagation times along the P2 and P3 of the twice-reflected signal components are the same.

In FIG. 11, the solid line is a graph of the voltage at an input to a memory controller in response to a voltage step output from a memory chip. As previously shown in FIG. 10, the voltage at the input to the memory controller has three major components. A primary component travels along a path PI having propagation time t1+t2, as shown in FIG. 9A. A first twice-reflected component travels along a path P2 having a propagation time of 3(t1)+t2, as shown in FIG. 9B. A second twice-reflected component travels along a path P3 having a propagation time of t1+3(t2), as shown in FIG. 9C. However, since 3(t1)+t2=t1+3(t2), the first twice-reflected component and second twice reflected component arrive at the memory controller essentially simultaneously. Since the first and second twice-reflected components have opposite polarity and nearly the same amplitude, they effectively cancel each other at the input to the memory controller (930 in FIGS. 9A-9C).

In FIG. 11, the dashed line plots the voltage at the input to the memory controller in response to a 750 picosecond voltage pulse launched by the memory chip. The first and second twice-reflected components of the pulse continue to propagate in the transmission lines after the original voltage pulse has ended. However, the propagation times of the first and second twice-reflected components are equal, the twice-reflected components effectively cancel each other at the input to the memory controller (930 in FIGS. 9A-9C), resulting in a significant reduction (compared, for example, to the data shown in FIG. 10) in inter-symbol interference that may degrade the quality of signals subsequently launched from either the memory chip or the memory controller.

FIG. 12A is an eye diagram of the input voltage at the memory controller, simulated using the same assumptions used to generated the data shown in FIG. 10. In the simulated example of FIG. 12A, the maximum eye opening voltage is 182 millivolts. FIG. 12B is an eye diagram of the input voltage at the memory controller, simulated using the same assumptions used to generated the data shown in FIG. 11. In the simulated example of FIG. 12B, the maximum eye opening voltage is 368 millivolts. Thus equalizing the propagation times t1, t2 of the first transmission line segment and the second transmission line segment causes the "eye" to further "open" and doubles the eye opening voltage compared to the previously presented results. Further, the improvement in the signal quality may allow computers to operate one DIMM or multiple DIMMs at the full speed capability of the memory chips.

The substantial improvement in signal quality, as evidenced by the eye opening voltage charts of FIG. 12A and FIG. 12B may be realized if two conditions are met. First, the two primary reflected components of the signal must have opposite polarity and approximately the same amplitude. The two primary reflected components may be considered to have "approximately the same amplitude" if the difference in the amplitudes of the two components is small compared to the eye opening voltage. This condition may be met by appropriate selection of the impedances of the first and second transmission line segments (955, 950 in the example of FIGS. 9A-9C) and/or appropriate selection of the output impedance at the signal source and the input impedance at the signal receiver. Second, the propagation delays of the signal paths (P2, P3 in the example of FIGS. 9A-9C) of the two primary reflected signal components must be approximately equal. The two primary reflected components may be considered to have approximately the same propagation delay if the difference in the propagation delays of the two components is small compared to the inverse of the memory transfer rate. Note that the propagation delay of a transmission line segment depends on the length of the line and the permittivity of the material adjacent to the transmission line segment. Thus equalizing the propagation delay of two transmission line segments is not necessarily the same as equalizing the lengths of the transmission lines.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A memory system, comprising:
   a system memory bus
   at least one memory module connected to the system memory bus, the memory module including at least one device, the device having at least one device D/Q (data input/output) terminal having a device output impedance when data is output from the memory module and a device input impedance when data is written into the memory module
   a memory controller connected to the system memory bus, the memory controller having at least one controller D/Q terminal coupled to the device D/Q terminal via the system memory bus, the controller D/Q terminal having a controller output impedance when data is written into the memory module and a controller input impedance when data is read from the memory module
   wherein a data signal propagates between the device D/Q terminal and the controller D/Q terminal as a primary signal via a direct path sequentially through a plurality of transmission line segments, each having a respective propagation delay and impedance, and as first and second reflected signals via first and second reflected paths
   wherein the first and second reflected signals have opposite polarity and similar amplitude and the first and second reflected paths have similar propagation delays such that the first and second reflected signals destructively interfere.

2. The memory system of claim 1, wherein:
   the device output impedance, the device input impedance, the controller output impedance, the controller input impedance, and the impedances of the transmission line segments are collectively configured such that the first and second reflected signals have opposite polarity and similar amplitude.

3. The memory system of claim 1, wherein:
   the propagation delays of the plurality of transmission line segments are collectively configured such that the first reflected path and second reflected path have similar propagation delays.

4. The memory system of claim 1, wherein the device is one of a memory chip and a buffer chip.

5. The memory system of claim 1, wherein the plurality of transmission line segments includes a first segment in the memory module and a second segment in the system memory bus.

6. The memory system of claim 5, wherein the first reflected path folds at a junction of the first segment and the second segment and folds at the device D/Q terminal
   the second reflected path folds at the junction of the first segment and the second segment and folds at the controller D/Q terminal.

* * * * *